(12) United States Patent
Chung et al.

(10) Patent No.: US 12,308,308 B2
(45) Date of Patent: May 20, 2025

(54) ELECTRONIC PACKAGE

(71) Applicant: SILICONWARE PRECISION INDUSTRIES CO., LTD., Taichung (TW)

(72) Inventors: Sung-Hua Chung, Taichung (TW); Liang-Pin Chen, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 397 days.

(21) Appl. No.: 17/853,097

(22) Filed: Jun. 29, 2022

(65) Prior Publication Data

US 2023/0343691 A1   Oct. 26, 2023

(30) Foreign Application Priority Data

Apr. 22, 2022   (TW) .................................. 111115468

(51) Int. Cl.
*H01L 23/498* (2006.01)
*H01L 23/00* (2006.01)
(Continued)

(52) U.S. Cl.
CPC .. *H01L 23/49838* (2013.01); *H01L 23/49822* (2013.01); *H01L 23/5381* (2013.01); *H01L 23/5386* (2013.01); *H01L 24/08* (2013.01); *H01L 24/16* (2013.01); *H01L 24/32* (2013.01); *H01L 24/73* (2013.01); *H01L 25/105* (2013.01); *H01L 23/49816* (2013.01); *H01L 23/49833* (2013.01); *H01L 23/5385* (2013.01); *H01L 2224/08235* (2013.01); *H01L 2224/16227* (2013.01); *H01L 2224/16235* (2013.01); *H01L 2224/16238* (2013.01); *H01L 2224/32225* (2013.01); *H01L 2224/73204* (2013.01);

(Continued)

(58) Field of Classification Search
CPC ......... H01L 23/49838; H01L 23/49822; H01L 23/5381; H01L 23/5386; H01L 23/49816; H01L 23/49833; H01L 23/5385; H01L 24/08; H01L 24/16; H01L 24/32; H01L 24/73; H01L 25/105; H01L 2224/08235; H01L 2224/16227; H01L 2224/16235; H01L 2224/16238; H01L 2224/32225; H01L 2224/73204; H01L 2225/1041; H01L 2225/107; H01L 2924/182; H01L 2924/3511; H01L 2924/37001
USPC ....................................................... 257/211
See application file for complete search history.

(56) References Cited

U.S. PATENT DOCUMENTS

| | | | | |
|---|---|---|---|---|
| 6,864,583 B2 * | 3/2005 | Matsunaga | ......... | H01L 23/5329 438/622 |
| 2012/0313243 A1* | 12/2012 | Chang | ..................... | H01L 24/19 257/737 |

* cited by examiner

*Primary Examiner* — Tu-Tu V Ho
(74) *Attorney, Agent, or Firm* — Dority & Manning, P.A.

(57) ABSTRACT

An electronic package is provided, in which an electronic structure is embedded in an encapsulation layer, a protective layer is formed on the encapsulation layer, an insulating layer is formed on the protective layer, and at least one blind via is formed penetrating through the insulating layer and the protective layer, so that the electronic structure is exposed from the blind via to make a circuit layer formed on the insulating layer extending into the blind via to electrically connect the electronic structure. Therefore, by the double layer design of the insulating layer and the protective layer, voids generated by the process are free from being transferred to the insulating layer to avoid the voids remaining in the circuit layer.

15 Claims, 4 Drawing Sheets

(51) Int. Cl.
*H01L 23/538* (2006.01)
*H01L 25/10* (2006.01)
(52) U.S. Cl.
CPC .............. *H01L 2225/1041* (2013.01); *H01L 2225/107* (2013.01); *H01L 2924/182* (2013.01); *H01L 2924/3511* (2013.01); *H01L 2924/37001* (2013.01)

ELECTRONIC PACKAGE

BACKGROUND

1. Technical Field

The present disclosure relates to a semiconductor device, and more particularly, to an electronic package which can improve reliability.

2. Description of Related Art

In order to ensure continued miniaturization and versatility of electronic products and communication apparatus, semiconductor packages need to be miniaturized in size to facilitate the connections of multi-pins and have high functionality.

FIG. 1 is a schematic cross-sectional view of a conventional semiconductor package 1. First, a through-silicon interposer (TSI) 10 having a transfer side 10a and a die placement side 10b opposite to the transfer side 10a is provided, and the through-silicon interposer 10 has a plurality of conductive through-silicon vias (TSVs) 100 connecting the transfer side 10a with the die placement side 10b, and a RDL (redistribution layer) type of a circuit structure 11 is formed on the die placement side 10b for connecting a semiconductor chip 15 having a smaller pitch of solder bumps 150, and the through-silicon interposer 10 is then disposed on a package substrate 13 having a larger line pitch by a plurality of conductive elements 18 with the transfer side 10a, such that the package substrate 13 is electrically connected to the conductive TSVs 100. Next, an encapsulant 16 is formed on the package substrate 13, so that the semiconductor chip 15 and the through-silicon interposer 10 are covered by the encapsulant 16. Lastly, a plurality of solder balls 12 are formed on lower side ball mounting pads 130 of the package substrate 13 for connecting a circuit board 1a.

In the case of the conventional semiconductor package 1, the power/signal transmission between the semiconductor chip 15 and the package substrate 13 is performed through the circuit structure 11.

However, if there is a need to increase the function of the semiconductor package 1, a plurality of the semiconductor chips 15 will need to be arranged on a single through-silicon interposer 10, so the number of routing layers of the circuit structure 11 needs to be increased (as a layer of a dielectric layer 110 shown in FIG. 1 being increased into a multi-layer dielectric layer), which results in the more routing layer the lower process yield, so that the semiconductor chip 15 cannot be electrically connected to the circuit structure 11 effectively, causing problems such as poor yield and reliability of the semiconductor package 1.

Therefore, how to overcome the aforementioned drawbacks of the prior art has become an urgent issue to be solved at present.

SUMMARY

In view of the various shortcomings of the prior art, the present disclosure provides an electronic package, which comprises: an encapsulation layer having a first surface and a second surface opposing the first surface; an electronic structure embedded in the encapsulation layer; a protective layer formed on the first surface of the encapsulation layer; an insulating layer formed on the protective layer and formed with at least one blind via penetrating through the insulating layer and the protective layer to expose the electronic structure from the blind via; and a circuit layer formed on the insulating layer and extending into the blind via to electrically connect to the electronic structure.

In the aforementioned electronic package, the electronic structure has a plurality of conductors and a cladding layer encapsulating the plurality of conductors.

In the aforementioned electronic package, the protective layer is formed of an insulating material.

In the aforementioned electronic package, the protective layer has a density of at least 3 g/cc.

In the aforementioned electronic package, the protective layer has an elastic modulus different from an elastic modulus of the insulating layer.

In the aforementioned electronic package, the insulating layer has an elastic modulus less than an elastic modulus of the protective layer.

In the aforementioned electronic package, the protective layer has an elastic modulus of at least 200 Gpa.

In the aforementioned electronic package, a sum of a thickness of the insulating layer and a thickness of the protective layer is same as a depth of the blind via.

In the aforementioned electronic package, the protective layer has a thickness of at least 0.6 micrometers.

In the aforementioned electronic package, a sum of a thickness of the insulating layer and a thickness of the protective layer is at least 5 micrometers.

In the aforementioned electronic package, the present disclosure further comprises a plurality of conductive pillars embedded in the encapsulation layer and electrically connected to the circuit layer.

In the aforementioned electronic package, the present disclosure further comprises a circuit structure formed on the second surface of the encapsulation layer and electrically connected to the electronic structure. The present disclosure further comprises at least one electronic element disposed on and electrically connected to the circuit structure. For example, a plurality of the electronic elements are disposed on the circuit structure, such that the electronic structure acts as a bridge element to electrically bridge the at least two electronic elements.

In the aforementioned electronic package, the present disclosure further comprises a plurality of conductive elements formed on and electrically connected to the circuit layer.

In the aforementioned electronic package, the electronic structure is a semiconductor chip and has a plurality of electrode pads electrically connected to the circuit layer.

As can be understood from the above, in the electronic package according to the present disclosure, voids generated by the cladding layer or the encapsulation layer cannot be transferred to the insulating layer mainly due to the design of the insulating layer and the protective layer, so that the voids can be prevented from remaining in the circuit layer. Therefore, the process yield of the circuit layer can be greatly improved by the electronic package of the present disclosure, so that the circuit layer can electrically connect the electronic structure and the conductive element effectively, thereby facilitating the improvement of the yield and reliability of the electronic package.

Furthermore, when there is a need to increase the function of the electronic package, only one electronic structure will have to be arranged on a single circuit structure without increasing the number of routing layers of the circuit structure. Therefore, compared to the prior art, the present disclosure can improve the process yield by controlling the number of routing layers of the circuit structure, so that the electronic element can be electrically connected to the circuit structure effectively, thereby improving the yield and reliability of the electronic package.

DETAILED DESCRIPTION

Figure 1:
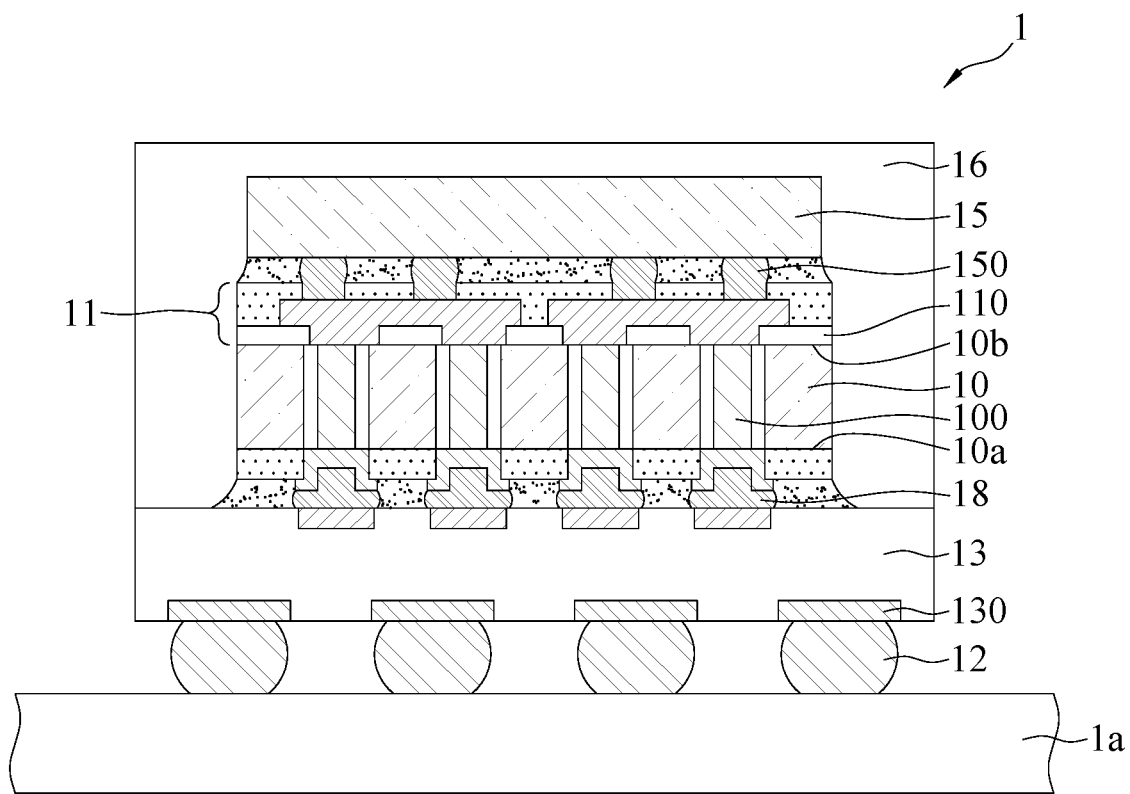
FIG. 1 is a schematic cross-sectional view of a conventional semiconductor package.

Implementations of the present disclosure are illustrated using the following embodiments. One of ordinary skill in the art can readily appreciate other advantages and technical effects of the present disclosure upon reading the content of this specification.

It should be noted that the structures, ratios, sizes, etc. shown in the drawings appended to this specification are to be construed in conjunction with the disclosure of this specification in order to facilitate understanding of those skilled in the art. They are not meant to limit the implementations of the present disclosure, and therefore have no substantial technical meaning. Any modifications of the structures, changes of the ratio relationships or adjustments of the sizes, are to be construed as falling within the range covered by the technical content disclosed herein to the extent of not causing changes in the technical effects created and the objectives achieved by the present disclosure. Meanwhile, terms such as "on," "first," "second," "a," and the like recited herein are for illustrative purposes, and are not meant to limit the scope in which the present disclosure can be implemented. Any variations or modifications to their relative relationships, without changes in the substantial technical content, should also to be regarded as within the scope in which the present disclosure can be implemented.

Figure 2A:
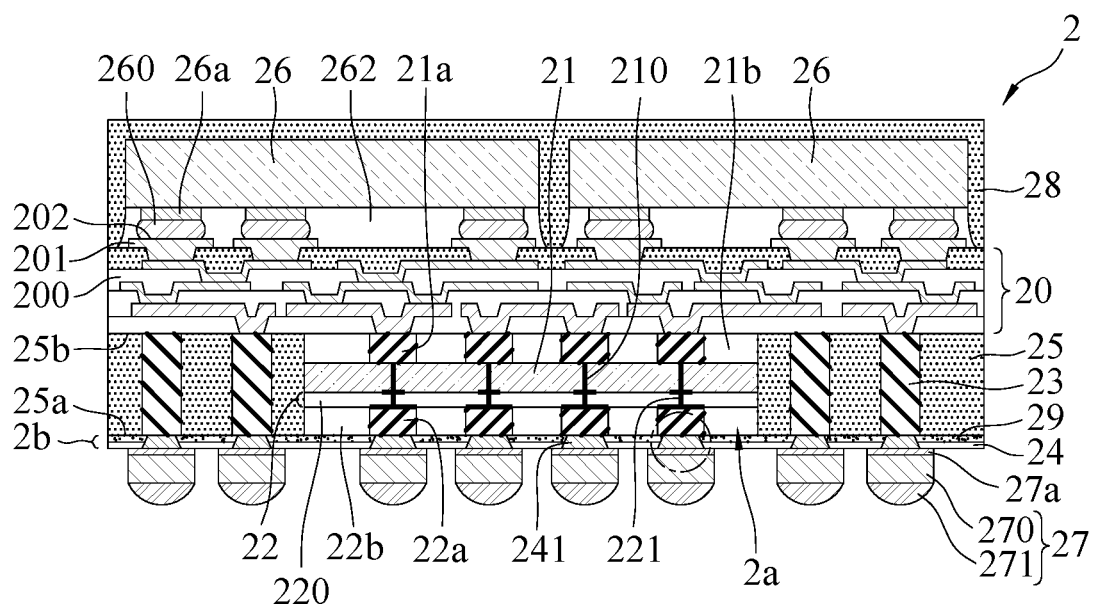
FIG. 2A is a schematic cross-sectional view of an electronic package in accordance with a first embodiment of the present disclosure.

FIG. 2A is a schematic cross-sectional view of an electronic package 2 in accordance with a first embodiment of the present disclosure. As shown in FIG. 2A, the electronic package 2 comprises: a first encapsulation layer 25, an electronic structure 2a embedded in the first encapsulation layer 25, a plurality of conductive pillars 23 embedded in the first encapsulation layer 25, and a routing structure 2b formed on the first encapsulation layer 25.

The first encapsulation layer 25 has a first surface 25a and a second surface 25b opposite to the first surface 25a.

In an embodiment, the first encapsulation layer 25 is an insulating material, such as polyimide (PI), dry film, encapsulant such as epoxy resin, or molding compound. For example, the first encapsulation layer 25 can be formed in a manner of liquid compound, injection, lamination, or compression molding, etc.

The electronic structure 2a comprises an electronic body 21, a circuit portion 22 formed on the electronic body 21, a plurality of first conductors 21a formed on the electronic body 21, and a plurality of second conductors 22a formed on the circuit portion 22 and electrically connected to the circuit portion 22, where the plurality of first conductors 21a and the plurality of second conductors 22a are encapsulated by a first cladding layer 21b and a second cladding layer 22b.

In an embodiment, the electronic body 21 is a silicon substrate, such as a semiconductor chip, which has a plurality of conductive vias 210 (such as through-silicon vias [TSVs]) penetrating through the electronic body 21 to electrically connect the circuit portion 22 and the plurality of first conductors 21a on different sides of the electronic body 21. For example, the circuit portion 22 comprises at least one passivation layer 220 and at least one conductive trace 221 boned with the passivation layer 220, so that the conductive trace 221 is electrically connected to each of the conductive vias 210 and each of the plurality of second conductors 22a. It should be understood that there are various aspects of the element structure with the conductive vias 210, and the present disclosure is not limited to as such.

Furthermore, the first conductors 21a and the second conductors 22a are metal pillars such as copper pillars, and the first cladding layer 21b and the second cladding layer 22b are non-conductive films (NCFs), primer or other insulating materials.

The conductive pillars 23 are metal pillars such as copper pillars or solder balls, which are electrically connected to the routing structure 2b.

In an embodiment, the first surface 25a of the first encapsulation layer 25 is flush with end surfaces of the conductive pillars 23 and end surfaces of the second conductors 22a, and the second surface 25b of the first encapsulation layer 25 is flush with end surfaces of the conductive pillars 23 and end surfaces of the first conductors 21a.

The routing structure 2b comprises a protective layer 29 bonded to the first encapsulation layer 25, at least one insulating layer 24 bonded to the protective layer 29, and a circuit layer 241 bonded to the insulating layer 24 and the protective layer 29, so that the circuit layer 241 is electrically connected to the plurality of second conductors 22a and the plurality of conductive pillars 23.

In an embodiment, the protective layer 29 is an insulating film, such as silicon nitride (SiN) of nitride or other organic dielectric materials, the density of which is at least 3 g/cc, and the insulating layer 24 is formed of a material such as polybenzoxazole (PBO), polyimide (PI), prepreg (PP), or other dielectric materials. And the circuit layer 241 can be formed in a manner of redistribution layer (RDL) process.

Figure 2B:
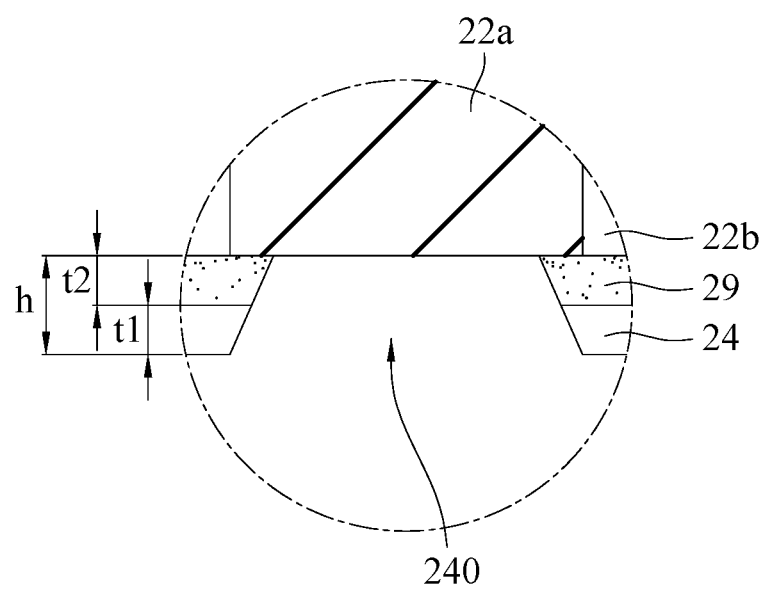
FIG. 2B is a schematic partially enlarged cross-sectional view of FIG. 2A.

Furthermore, the circuit layer 241 is penetrated through the insulating layer 24 and the protective layer 29 to contact with the second conductor 22a. For example, a blind via 240 penetrating through the insulating layer 24 and the protective layer 29 is first formed, as shown in FIG. 2B, so that the second conductor 22a is exposed from the blind via 240. And then a copper material is formed in the blind via 240 by electroplating or other methods, so that the circuit layer 241 is extended inside the blind via 240 to electrically connect the second conductor 22a, wherein a sum of a thickness t1 of the insulating layer 24 and a thickness t2 of the protective layer 29 is equal to a depth h of the blind via 240. Further, the thickness t2 of the protective layer 29 is at least 0.6 micrometers (μm). For instance, the sum of the thickness t1 of the insulating layer 24 and the thickness t2 of the protective layer 29 is at least 5 micrometers to avoid warpage or other problems caused by stress concentration.

Also, an elastic modulus of the protective layer 29 is different from an elastic modulus of the insulating layer 24. For example, the elastic modulus of the insulating layer 24

(about 5.2 Gpa) is less than the elastic modulus of the protective layer 29 (at least 200 Gpa).

Further, a plurality of conductive elements 27 can be formed on the routing structure 2b, so that the plurality of conductive elements 27 are electrically connected to the circuit layer 241.

In an embodiment, the conductive element 27 comprises a metal bump 270 (such as copper) and a solder material 271 formed on the metal bump 270. For example, an under bump metallization (UBM) layer (not shown) may be formed on the circuit layer 241 to facilitate the bonding of the metal bump 270.

Therefore, in the electronic package 2 in accordance with the present disclosure, a multi-layer structure of the insulating layer 24 and the protective layer 29 is formed on the first surface 25a of the first encapsulation layer 25 when fabricating the single circuit layer 241 to increase the thickness of the insulating material, so that voids generated by the second cladding layer 22b (NCF) in the subsequent thermal process cannot be transferred to the insulating layer 24, which may prevent the voids from escaping into the blind via 240 and causing the problem of insufficient structural strength of the circuit layer 241 (i.e., containing voids instead of whole solid structures), the process yield of the circuit layer 241 of the present disclosure thus can be greatly improved so as to electrically connect to the electronic structure 2a and the conductive elements 27 effectively, thereby improving the yield and reliability of the electronic package 2.

In other embodiments, the electronic package 2 further comprises: a circuit structure 20 disposed on the first encapsulation layer 25, at least one (or a plurality of) electronic element 26 disposed on the circuit structure 20, and a second encapsulation layer 28 encapsulating the electronic element 26.

The circuit structure 20 is formed on the second surface 25b of the first encapsulation layer 25, so that the circuit structure 20 is electrically connected to the conductive pillars 23 and the plurality of first conductors 21a.

In an embodiment, the circuit structure 20 comprises at least one dielectric layer 200 and a redistribution layer 201 formed on the dielectric layer 200, such that the redistribution layer 201 is electrically connected to the plurality of conductive pillars 23 and the plurality of first conductors 21a, wherein the outermost dielectric layer 200 can be served as a solder mask layer and the outermost redistribution layer 201 can be exposed from the solder mask layer to serve as electrical contact pads 202 (such as micro pads, so called μ-pads).

Further, the material for forming the redistribution layer 201 is copper, and the material of the dielectric layer 200 is formed of a dielectric material such as polybenzoxazole (PBO), polyimide (PI), prepreg (PP), etc., or solder resist materials such as solder mask, graphite, etc.

The electronic element 26 is an active element, a passive element, or a combination of the active element and the passive element, where the active element is such as a semiconductor chip, and the passive element is such as a resistor, a capacitor, or an inductor.

In an embodiment, the electronic element 26 is a semiconductor chip such as a graphics processing unit (GPU), a high bandwidth memory (HBM), etc. For example, the electronic element 26 can be electrically connected to the redistribution layer 201 via flip-chip method, wire-bonding method, directly contacting with the circuit structure 20 or other suitable methods, and the present disclosure is not limited to as such.

Further, if the electronic element 26 is using the flip-chip method, it can be electrically connected to the electrical contact pads 202 via a plurality of conductive bumps 26a (such as copper pillars) and a solder material 260. In an embodiment, an under bump metallurgy (UBM) layer can be formed on the electrical contact pads 202 or the electronic element 26 to facilitate the bonding of the solder material 260 or the conductive bumps 26a.

Also, if multiple electronic elements 26 are arranged on the circuit structure 20, the electronic structure 2a may act as a bridge element (e.g., a bridge die), so that the electronic structure 2a is electrically connected to the redistribution layer 201 by the first conductors 21a to electrically bridge at least two electronic elements 26.

The second encapsulation layer 28 is an insulating material, such as polyimide (PI), dry film, encapsulant such as epoxy resin, or molding compound, which can be formed on the circuit structure 20 in a manner of lamination or molding. It should be understood that the material of the second encapsulation layer 28 can be the same as or different from the material of the first encapsulation layer 25.

In an embodiment, an underfill 262 can be formed firstly between the electronic elements 26 and the circuit structure 20 to encapsulate the conductive bumps 26a and the solder material 260, and the second encapsulation layer 28 is then formed to encapsulate the underfill 262 and the electronic elements 26. Alternatively, the second encapsulation layer 28 can be formed to directly and concurrently encapsulate the electronic elements 26, the conductive bumps 26a and the solder material 260.

Figure 3:
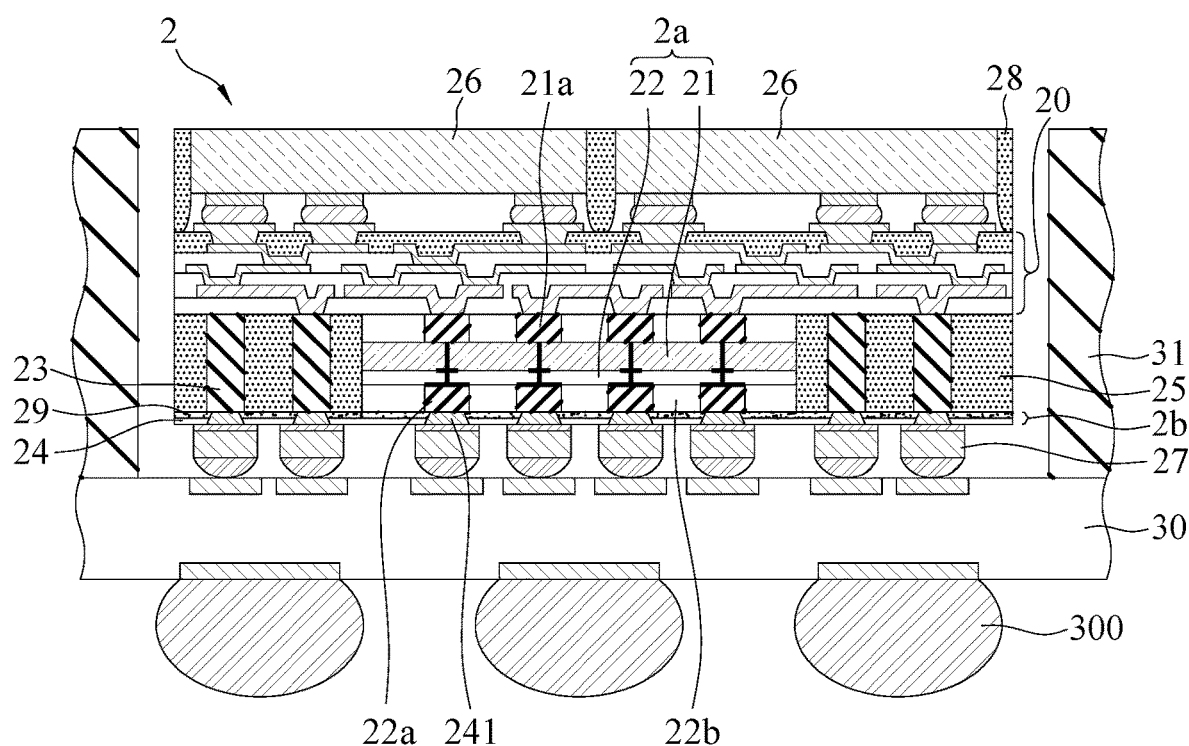
FIG. 3 is a schematic cross-sectional view of the application of FIG. 2A.

Further, the partial material of the second encapsulation layer 28 may be removed by a leveling process, such as grinding, so that an upper surface of the second encapsulation layer 28 is flush with upper surfaces of the electronic elements 26 (as shown in FIG. 3), such that the electronic elements 26 are exposed from the second encapsulation layer 28.

Therefore, the present disclosure uses the electronic structure 2a as a bridge element to electrically bridge at least two electronic elements 26, so when there is a need to increase the function of the electronic package 2, only one electronic structure 2a will need to be arranged on a single circuit structure 20 without increasing the number of layers of the redistribution layer 201. Therefore, compared with the prior art, the circuit structure 20 of the present disclosure can improve the process yield by controlling the number of layers of the redistribution layer 201, so that the electronic elements 26 can be electrically connected to the redistribution layer 201 effectively, thereby improving the yield and reliability of the electronic package 2.

Moreover, as shown in FIG. 3, the electronic package 2 can be arranged on a package substrate 30 by the conductive elements 27. Further, a ball placement process is performed on the underside of the package substrate 30 to form a plurality of solder balls 300, so that the package substrate 30 can be disposed on a circuit board (not shown) via the solder balls 300 on the underside of the package substrate 30.

In addition, a strengthening element 31, such as a metal frame shown in FIG. 3, can be provided on the package substrate 30 according to requirements, so as to eliminate the problem of stress concentration and avoid the warpage of the electronic package 2.

Figure 4:
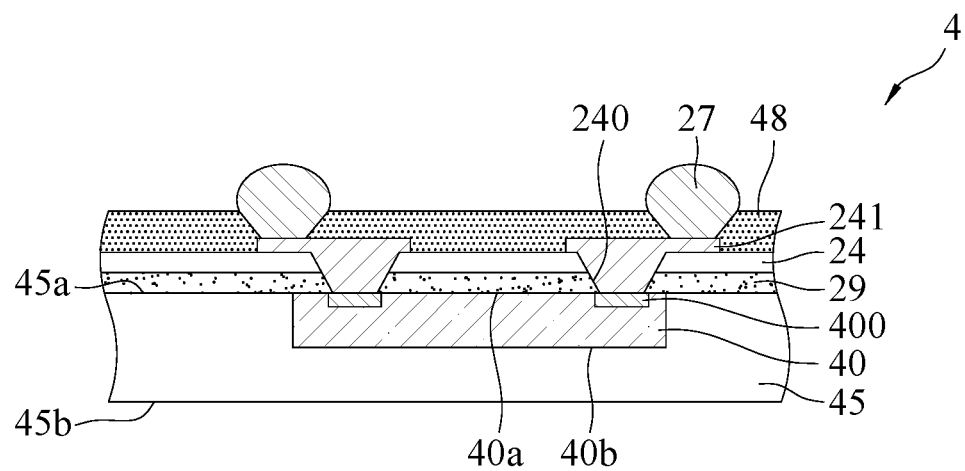
FIG. 4 is a schematic cross-sectional view of an electronic package in accordance with a second embodiment of the present disclosure.

FIG. 4 is a schematic cross-sectional view of an electronic package 4 in accordance with a second embodiment of the present disclosure. As shown in FIG. 4, the electronic package 4 is packaged with fan-out wafer-level chip specification and comprises: an encapsulation layer 45, an electronic structure 40 embedded in the encapsulation layer 45, a protective layer 29 bonded onto the encapsulation layer 45, an insulating layer 24 bonded onto the protective layer 29, and a circuit layer 241 formed on the insulating layer 24.

The encapsulation layer 45 has a first surface 45a and a second surface 45b opposite to the first surface 45a, so that the protective layer 29 is bonded onto the first surface 45a of the encapsulation layer 45.

Figure 5:
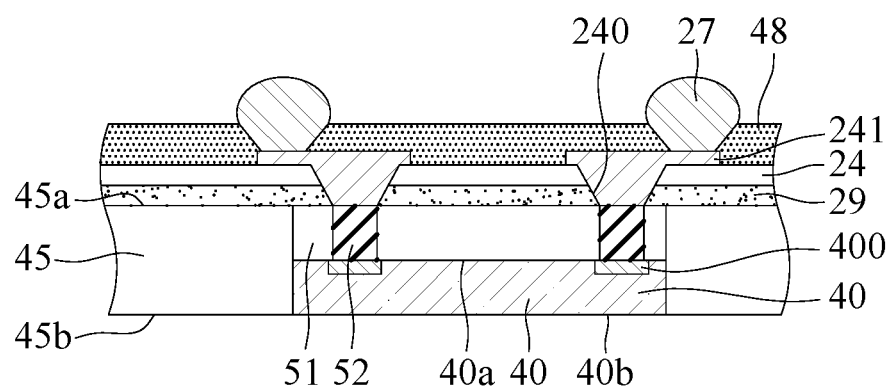
FIG. 5 is a schematic cross-sectional view of another aspect of FIG. 4.

The electronic structure 40 is an active element, a passive element, or a combination of the active element and the passive element, wherein the active element is such as a semiconductor chip, and the passive element is such as a resistor, a capacitor, or an inductor. In an embodiment, the electronic structure 40 is a semiconductor chip and has an active surface 40a and an inactive surface 40b opposite to the active surface 40a, the active surface 40a has a plurality of electrode pads 400, and the inactive surface 40b can be exposed according to requirements (as shown in FIG. 5, the inactive surface 40b is coplanar with the second surface 45b of the encapsulation layer 45).

The insulating layer 24 is provided with at least one blind via 240 formed penetrating through the insulating layer 24 and the protective layer 29, so that the electrode pad 400 of the electronic structure 40 is exposed from the blind via 240.

The circuit layer 241 extends into the blind via 240 to electrically connect the electrode pad 400 of the electronic structure 40. In an embodiment, a plurality of the conductive elements 27 can be formed on the circuit layer 241, so that the electronic package 4 can be mounted onto the package substrate 30 of FIG. 3 or a circuit board (not shown) via the plurality of conductive elements 27. Further, an insulating protective layer 48 such as a solder mask layer can be formed on the insulating layer 24, and a part of the surface of the circuit layer 241 is exposed from the insulating protective layer 48 for bonding the conductive element 27.

Therefore, in the electronic package 4 in accordance with the present disclosure, a multi-layer structure of the insulating layer 24 and the protective layer 29 is formed on the first surface 45a of the encapsulation layer 45 when fabricating the single circuit layer 241 to increase the thickness of the insulating material, so that voids generated by the encapsulation layer 45 in the subsequent thermal process cannot be transferred to the insulating layer 24, which may prevent the voids from escaping into the blind via 240 and causing the problem of insufficient structural strength of the circuit layer 241 (i.e., containing voids instead of whole solid structures), the process yield of the circuit layer 241 of the present disclosure thus can be greatly improved so as to electrically connect to the electronic structure 40 and the conductive element 27 effectively, thereby improving the yield and reliability of the electronic package 4.

It should be understood that there are many types of fan-out wafer level chip specifications. As shown in FIG. 5, conductors 52 such as metal pillars can be arranged on the electrode pads 400 of the active surface 40a of the electronic structure 40, and the conductors 52 are encapsulated by a cladding layer 51 such as an adhesive film, thus there is no particular limitation on the form of the fan-out wafer level chip specification.

To sum up, in the electronic package according to the present disclosure, the voids generated by the cladding layer or the second cladding layer (or the first encapsulation layer, encapsulation layer) cannot be transferred to the insulating layer mainly due to the design of the insulating layer and the protective layer, so that the voids can be prevented from remaining in the circuit layer. Therefore, the present disclosure can greatly improve the process yield of the circuit layer so as to electrically connect the electronic structure with the conductive element effectively, thereby improving of the yield and reliability of the electronic package.

Further, when there is a need to increase the function of the electronic package, by using the electronic structure as a bridge element to electrically bridge at least two electronic elements, only one electronic structure will have to be arranged on a single circuit structure without increasing the number of layers of the redistribution layers. Therefore, the present disclosure can improve the process yield by controlling the number of layers of the redistribution layers, so that the electronic element can be electrically connected to the redistribution layers effectively so as to improve the yield and reliability of the electronic package.

The above embodiments are set forth to illustrate the principles of the present disclosure, and should not be interpreted as to limit the present disclosure. The above embodiments can be modified by one of ordinary skill in the art without departing from the scope of the present disclosure as defined in the appended claims. Therefore, the scope of protection of the right of the present disclosure should be listed as the following appended claims.

What is claimed is:

1. An electronic package, comprising:
   an encapsulation layer having a first surface and a second surface opposing the first surface;
   an electronic structure embedded in the encapsulation layer and having a plurality of conductors and a cladding layer encapsulating the plurality of conductors;
   a protective layer formed on the first surface of the encapsulation layer;
   an insulating layer formed on the protective layer and formed with at least one blind via penetrating through the insulating layer and the protective layer to expose the electronic structure from the blind via; and
   a circuit layer formed on the insulating layer and extending into the blind via to electrically connect to the electronic structure.

2. The electronic package of claim 1, wherein the protective layer is formed of an insulating material.

3. The electronic package of claim 1, wherein the protective layer has a density of at least 3 g/cc.

4. The electronic package of claim 1, wherein the protective layer has an elastic modulus different from an elastic modulus of the insulating layer.

5. The electronic package of claim 1, wherein the insulating layer has an elastic modulus less than an elastic modulus of the protective layer.

6. The electronic package of claim 1, wherein the protective layer has an elastic modulus of at least 200 Gpa.

7. The electronic package of claim 1, wherein a sum of a thickness of the insulating layer and a thickness of the protective layer is same as a depth of the blind via.

8. The electronic package of claim 1, wherein the protective layer has a thickness of at least 0.6 micrometers.

9. The electronic package of claim 1, wherein a sum of a thickness of the insulating layer and a thickness of the protective layer is at least 5 micrometers.

10. The electronic package of claim 1, further comprising a plurality of conductive pillars embedded in the encapsulation layer and electrically connected to the circuit layer.

11. The electronic package of claim 1, further comprising a circuit structure formed on the second surface of the encapsulation layer and electrically connected to the electronic structure.

12. The electronic package of claim 11, further comprising at least one electronic element disposed on and electrically connected to the circuit structure.

13. The electronic package of claim 12, wherein a plurality of the electronic elements are disposed on the circuit structure, such that the electronic structure acts as a bridge element to electrically bridge the at least two electronic elements.

14. The electronic package of claim 1, further comprising a plurality of conductive elements formed on and electrically connected to the circuit layer.

15. The electronic package of claim 1, wherein the electronic structure is a semiconductor chip and has a plurality of electrode pads electrically connected to the circuit layer.

* * * * *